United States Patent
Hsieh et al.

(10) Patent No.: US 11,506,685 B1
(45) Date of Patent: Nov. 22, 2022

(54) PROBE CARD DEVICE AND DISPOSABLE ADJUSTMENT FILM THEREOF

(71) Applicant: CHUNGHWA PRECISION TEST TECH. CO., LTD., Taoyuan (TW)

(72) Inventors: Kai-Chieh Hsieh, Taoyuan (TW); Wei-Jhih Su, Taichung (TW); Chao-Hui Tseng, New Taipei (TW); Hsien-Yu Wang, Taoyuan (TW); Vel Sankar Ramachandran, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/491,630

(22) Filed: Oct. 1, 2021

(30) Foreign Application Priority Data

May 14, 2021 (TW) .................................. 110117393

(51) Int. Cl.
*G01R 1/073* (2006.01)
*G01R 1/067* (2006.01)
*H01R 12/70* (2011.01)

(52) U.S. Cl.
CPC ..... *G01R 1/07314* (2013.01); *G01R 1/06716* (2013.01); *H01R 12/7005* (2013.01)

(58) Field of Classification Search
CPC ............ G01R 1/07314; G01R 1/06716; H01R 12/7005
See application file for complete search history.

(56) References Cited

U.S. PATENT DOCUMENTS

| | | | | |
|---|---|---|---|---|
| 3,874,910 A | * | 4/1975 | Altmann | F24D 3/141 174/138 R |
| 5,744,948 A | * | 4/1998 | Swart | G01R 1/07307 324/754.09 |
| 2004/0209520 A1 | * | 10/2004 | Takada | H01R 12/7005 439/638 |

OTHER PUBLICATIONS

DE-19626803-A1 with English translation (Year: 1997).*

* cited by examiner

*Primary Examiner* — Paresh Patel
(74) *Attorney, Agent, or Firm* — Li & Cai Intellectual Property (USA) Office

(57) ABSTRACT

A probe card device and a disposable adjustment film thereof are provided. The disposable adjustment film is integrally formed as a single one-piece structure, and includes a probe hole and a plurality of first slots that are parallel to each other. The disposable adjustment film defines two predetermined lines respectively extending from two opposite lateral edges thereof to the probe hole. The two predetermined lines respectively extend across the first slots. In a plane that the disposable adjustment film is located thereon, when the disposable adjustment film is applied with forces that act in opposite directions and that are parallel to any one of the first slots, the disposable adjustment film is broken into two abandoned films along the two predetermined lines.

10 Claims, 11 Drawing Sheets

PROBE CARD DEVICE AND DISPOSABLE ADJUSTMENT FILM THEREOF

CROSS-REFERENCE TO RELATED PATENT APPLICATION

This application claims the benefit of priority to Taiwan Patent Application No. 110117393, filed on May 14, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a disposable adjustment film thereof.

BACKGROUND OF THE DISCLOSURE

A conventional probe card device includes a probe holder and a plurality of thickening layers that are stacked in the probe holder. Each of the thickening layers has two thickening sheets that are separate from each other and that can be pulled away from the probe holder according to user requirements. However, in any two of the thickening sheets respectively arranged in different thickening layers and stacked with each other, one of the any two of the thickening sheets can easily cause an interference (e.g., an offset) to another one of the any two of the thickening sheets when being pulled away from the probe holder, thereby affecting the precision of the probe holder.

SUMMARY OF THE DISCLOSURE

In response to the above-referenced technical inadequacy, the present disclosure provides a probe card device and a disposable adjustment film thereof to effectively improve on the issues associated with conventional probe card devices.

In one aspect, the present disclosure provides a probe card device, which includes a probe holder and a plurality of conductive probes that are assembled to the probe holder. The probe holder includes two guiding board units, a spacing board, a plurality of disposable adjustment films, and a plurality of fasteners. The two guiding board units are spaced apart from each other. The spacing board is located between the two guiding board units. The disposable adjustment films are stacked along a height direction and are sandwiched between the spacing board and at least one of the two guiding board units. Each of the disposable adjustment films is integrally formed as a single one-piece structure and has a probe hole and a plurality of first slots that are parallel to each other. Each of the disposable adjustment films defines two predetermined lines respectively extending from two opposite lateral edges thereof to the probe hole. The two predetermined lines respectively extend across the first slots. The fasteners fix the two guiding board units, the spacing board, and the disposable adjustment films. The fasteners respectively pass through the first slots of each of the disposable adjustment films. The conductive probes pass through the probe hole of each of the disposable adjustment films. In a plane perpendicular to the height direction, when any one of the disposable adjustment films is applied with forces that act in opposite directions and that are parallel to any one of the first slots, the any one of the disposable adjustment films is broken into two abandoned films along the two predetermined lines, and the two abandoned films are moved along the fasteners through the first slots so as to be removed from the probe holder.

Therefore, each of the disposable adjustment films of the probe card device in the present disclosure is integrally formed as a single one-piece structure to allow the same to be retained or limited by other components (e.g., the fasteners and the guiding pins), so that any one of the disposable adjustment films does not affect or move another one of the disposable adjustment films when being broken into the two abandoned films by being applied with forces, thereby maintaining the precision of the probe holder.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

First Embodiment

Figure 1:
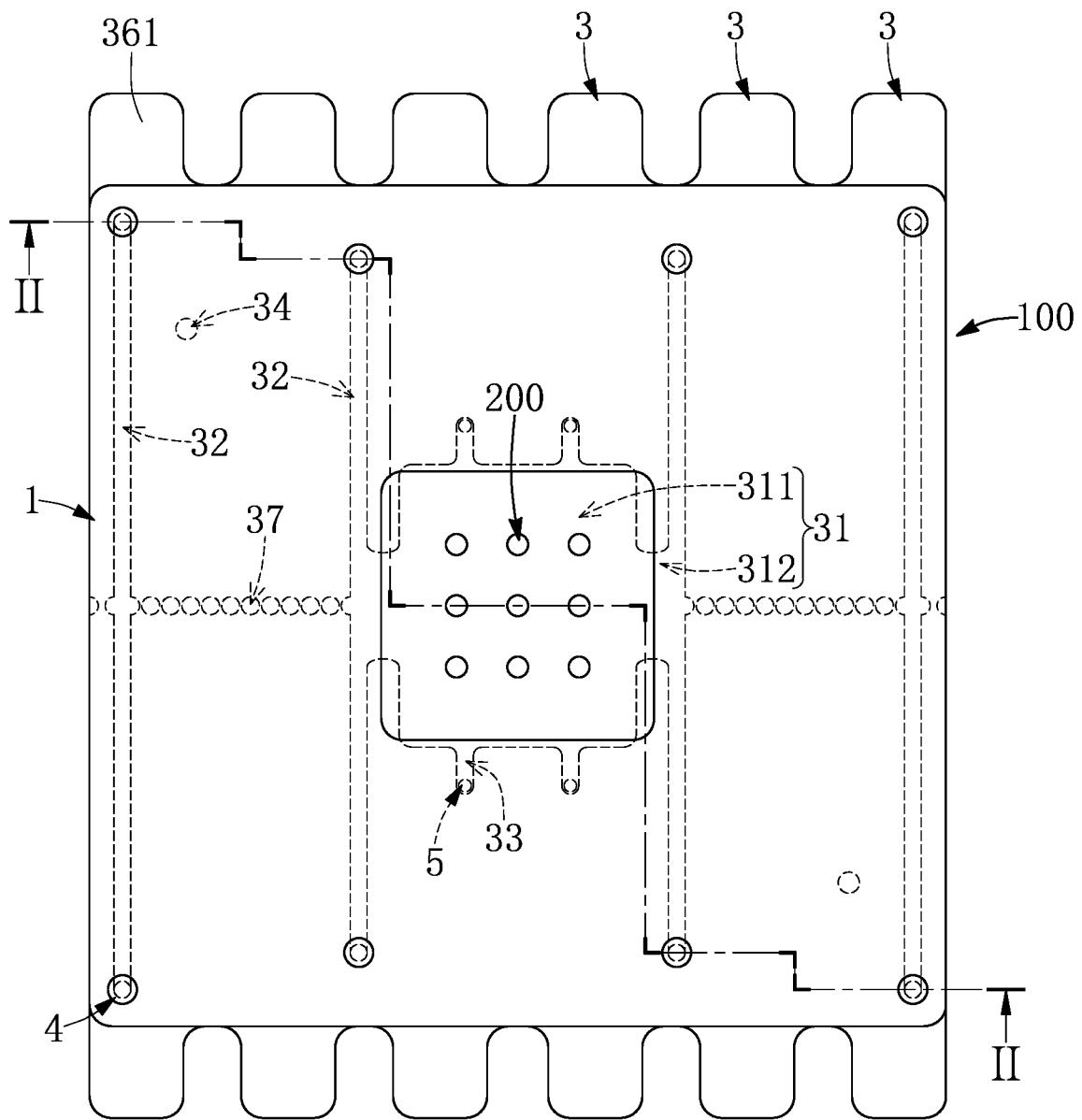
FIG. 1 is a top view of a probe holder of a probe card device according to a first embodiment of the present disclosure.
Figure 2:
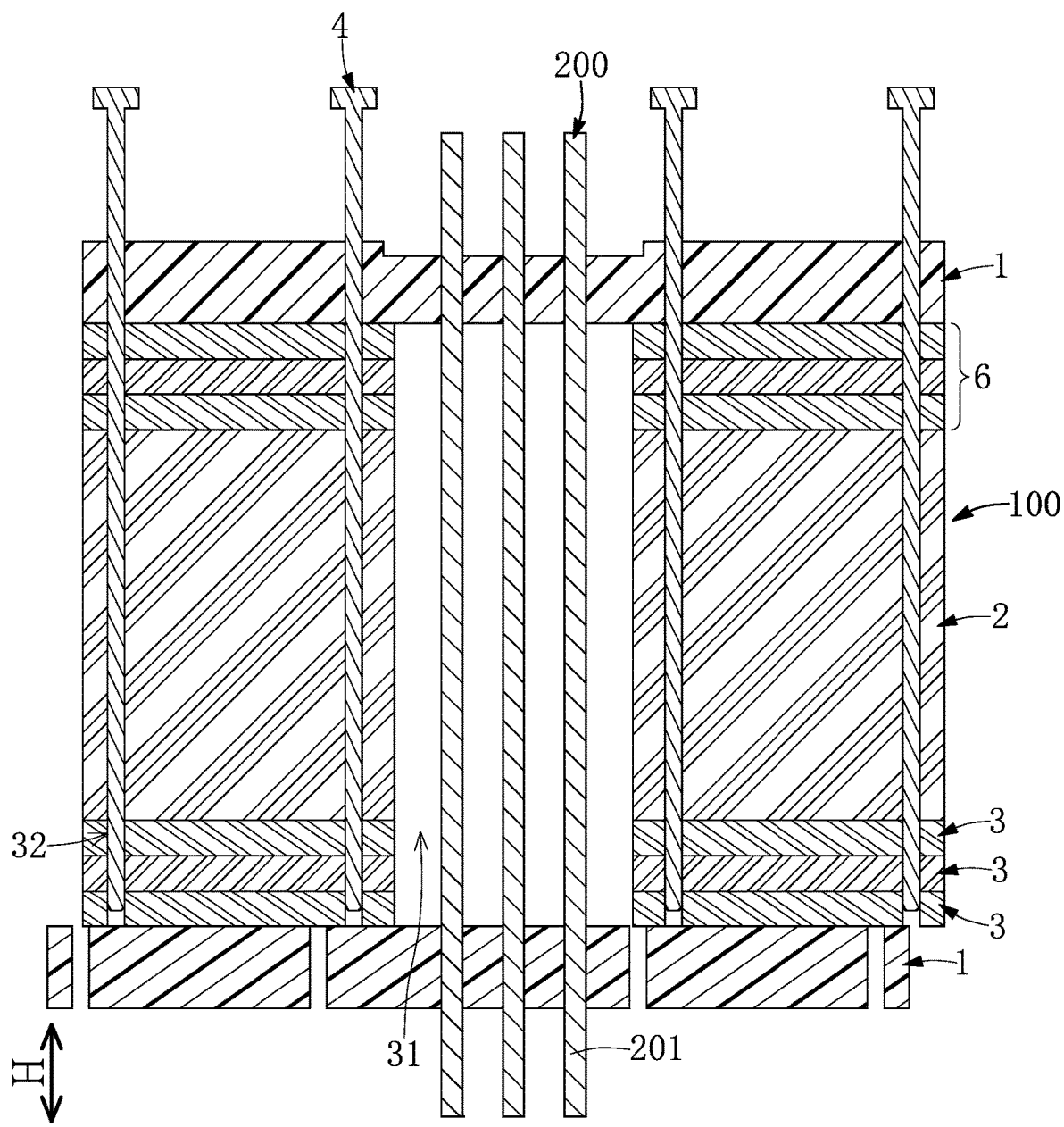
FIG. 2 is a cross-sectional view taken along line II-II of FIG. 1.
Figure 3:
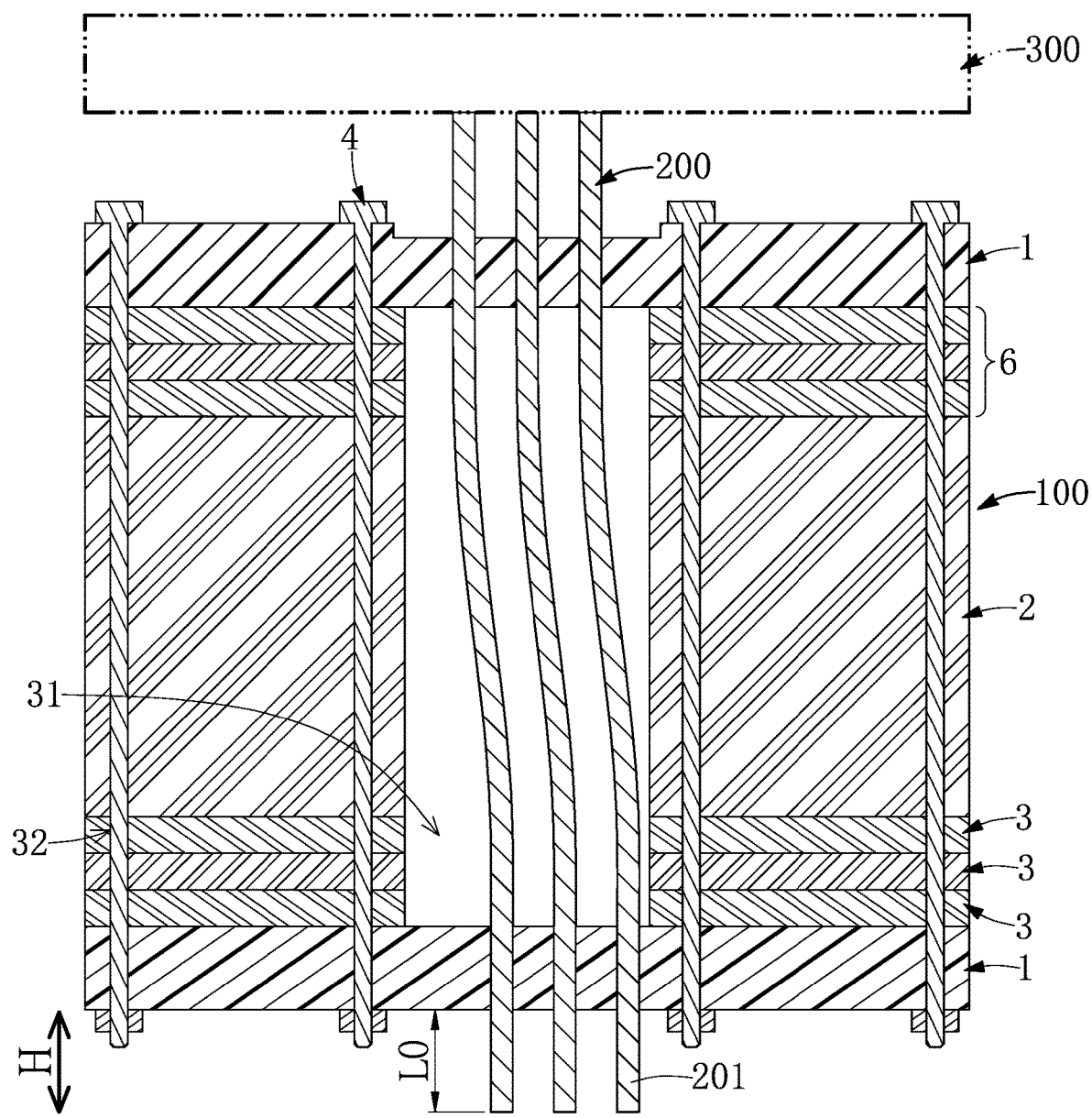
FIG. 3 is a cross-sectional view of the probe card device according to the first embodiment of the present disclosure.

Referring to FIG. 1 to FIG. 9, a first embodiment of the present disclosure provides a probe card device 1000, which can be a vertical probe card device. As shown in FIG. 1 to FIG. 3, the probe card device 1000 includes a probe holder 100, a plurality of conductive probes 200 assembled to the probe holder 100, and a space transformer 300 that is located at one side of the probe holder 100.

It should be noted that the probe card device 1000 in the present embodiment includes the above components, but the present disclosure is not limited thereto. For example, in other embodiments of the present disclosure not shown in the drawings, the probe card device 1000 can be used (e.g., sold) without having the space transformer 300. The following description describes the structural and connection relationship of each component of the probe card device 1000.

The probe holder 100 includes two guiding board units 1, a spacing board 2 located between the two guiding board units 1, a plurality of disposable adjustment films 3 sandwiched between the spacing board 2 and at least one of the two guiding board units 1, a plurality of fasteners 4 (e.g., screws), and a plurality of guiding pins 5. It should be noted that the probe holder 100 in the present embodiment includes the above components, but the present disclosure is not limited thereto. For example, in other embodiments of the present disclosure not shown in the drawings, the probe holder 100 can be provided without the guiding pins 5; or, the disposable adjustment film 3 can be independently used (e.g., sold) without being in cooperation with other components. The following description describes the structural and connection relationship of each component of the probe holder 100.

As shown in FIG. 2 and FIG. 3, the two guiding board units 1 are spaced apart from each other and are substantially parallel to the space transformer 300. One of the two guiding board units 1 (e.g., the upper guiding board unit 1 shown in FIG. 3) is located adjacent to the space transformer 300, and another one of the two guiding board units 1 (e.g., the lower guiding board unit 1 shown in FIG. 3) is located away from the space transformer 300. Specifically, any one of the two guiding board units 1 in the present embodiment has a plurality of holes (not labeled in the drawings) according to the disposable adjustment film 3 and can be a single guiding board, but the present disclosure is not limited thereto. For example, in other embodiments of the present disclosure not shown in the drawings, any one of the two guiding board units 1 can include two guiding boards and a spacer that is sandwiched between the two guiding boards.

The spacing board 2 in the present embodiment is in an annular shape and has a plurality of holes (not labeled in the drawings) according to the disposable adjustment film 3. The disposable adjustment films 3 are stacked along a height direction H, and the disposable adjustment films 3 in the present embodiment are sandwiched between the spacing board 2 and the guiding board unit 1 (e.g., the lower guiding board unit 1 shown in FIG. 3) away from the space transformer 300. Moreover, the spacing board 2 and the guiding board unit 1 (e.g., the upper guiding board unit 1 shown in FIG. 3) adjacent to the space transformer 300 sandwich a plurality of thickening sheets 6 there-between, but the present disclosure is not limited thereto.

For example, in other embodiments of the present disclosure not shown in the drawings, the disposable adjustment films 3 can be sandwiched between the spacing board 2 and the guiding board unit 1 adjacent to the space transformer 300, and the spacing board 2 and the guiding board unit 1 away from the space transformer 300 are provided with the thickening sheets 6 there-between; or, the disposable adjustment films 3 can be sandwiched between the spacing board 2 and any one of the two guiding board units 1.

Each of the disposable adjustment films 3 is integrally formed as a single one-piece structure, and has a thickness within a range from 50 μm to 500 μm. Moreover, a difference between the thicknesses of any two of the disposable adjustment films 3 is less than or equal to 10 μm. As the disposable adjustment films 3 in the present embodiment are of the substantially same structure, the following description discloses the structure and connection relationship of just one of the disposable adjustment films 3 for the sake of brevity, but the present disclosure is not limited thereto. For example, in other embodiments of the present disclosure, the disposable adjustment films 3 can be of different structures.

Figure 4:
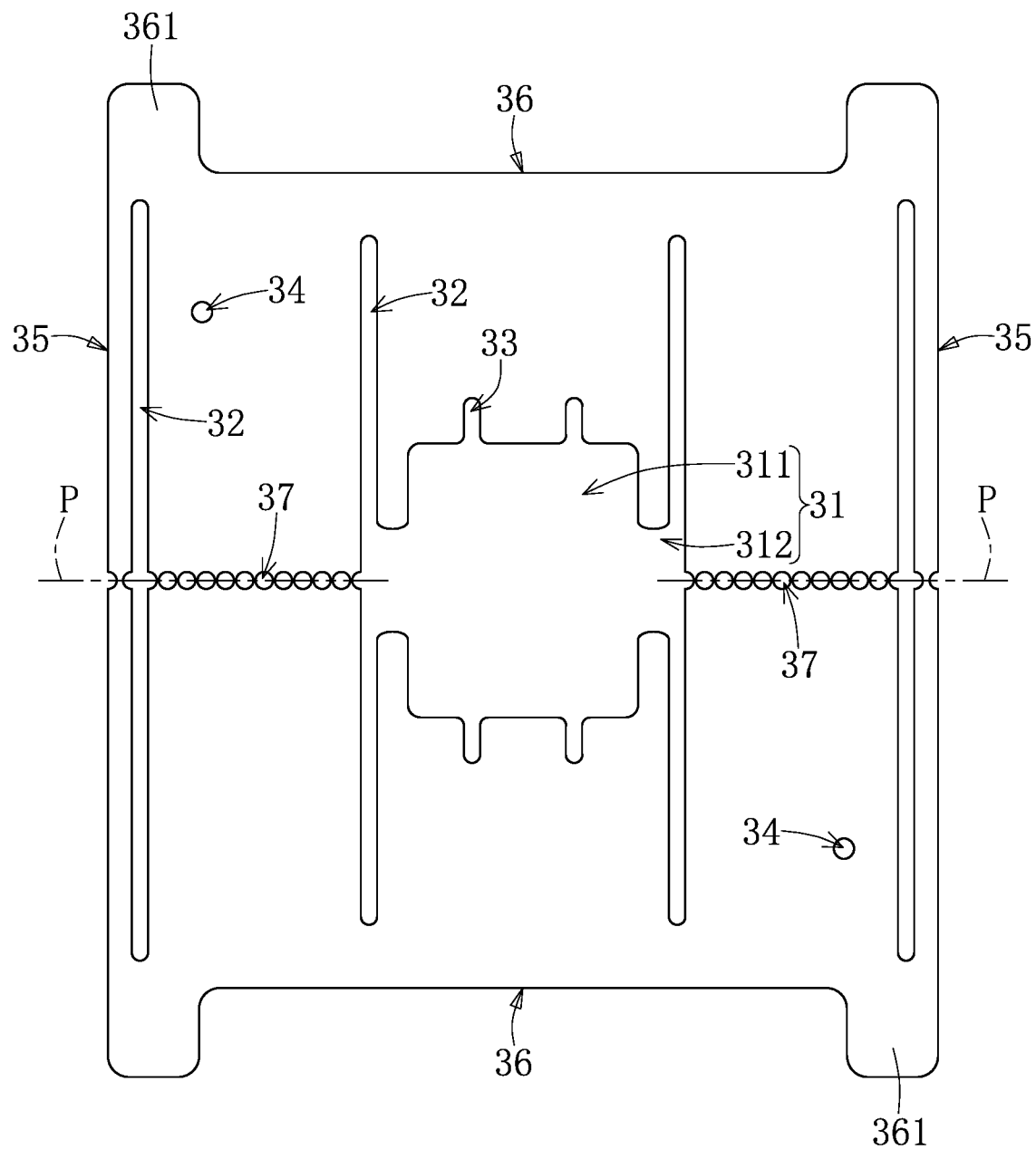
FIG. 4 is a top view of a disposable adjustment film according to the first embodiment of the present disclosure.

Specifically, as shown in FIG. 1 and FIG. 4, the disposable adjustment film 3 is substantially in a square shape or a rectangular shape, and has a probe hole 31, a plurality of first slots 32 parallel to each other, a plurality of second slots 33 in spatial communication with the probe hole 31, and a plurality of aligning holes 34. The probe hole 31 has a placing hole 311 substantially arranged on a center portion thereof and two buffering holes 312 that are in spatial communication with two opposite sides of the placing hole 311 (e.g., a left side and a right side of the placing hole 311 shown in FIG. 4), respectively.

Moreover, a quantity of the first slots 32 in the present embodiment is four, and the first slots 32 are respectively located at the two opposite sides of the placing hole 311 (e.g., the left side and the right side of the placing hole 311 shown in FIG. 4). Two of the first slots 32 adjacent to the placing hole 311 are respectively in spatial communication with the two buffering holes 312, and another two of the first slots 32 are parallel to and adjacent to two opposite lateral edges 35 of the disposable adjustment film 3 (e.g., a left lateral edge and a right lateral edge of the disposable adjustment film 3 shown in FIG. 4). Moreover, a longitudinal direction of each of the first slots 32 is perpendicular to two end edges 36 of the disposable adjustment film 3 (e.g., a top end edge and a bottom end edge of the disposable adjustment film 3 shown in FIG. 4). In other words, each of the two end edges 36 is perpendicular to the two lateral edges 35.

A quantity of the second slots 33 in the present embodiment is four, and the second slots 33 are respectively in spatial communication with two opposite ends of the placing hole 311 (e.g., a top end and a bottom end of the placing hole 311 shown in FIG. 4) and are parallel to any one of the first slots 32. In other words, the second slots 33 are located between the two of the first slots 32 adjacent to the placing hole 311. In addition, a distance between the two of the first slots 32 adjacent to the placing hole 311 can be divided into three equal parts by two of the second slots 33 in spatial communication with any one of the two ends of the placing hole 311, but the present disclosure is not limited thereto.

A quantity of the aligning holes 34 in the present embodiment is two, any one of the aligning holes 34 is in a circular shape and is not in spatial communication with any hole or slot of the disposable adjustment film 3, and the aligning holes 34 are substantially arranged on two diagonally opposite corners of the disposable adjustment film 3 (e.g., an upper left corner and a lower right corner of the disposable adjustment film 3 shown in FIG. 4), respectively, but the present disclosure is not limited thereto.

In other words, the disposable adjustment film 3 defines two predetermined lines P respectively extending from the two lateral edges 35 thereof to the probe hole 31. The two predetermined lines P respectively extend across the first slots 32, and the disposable adjustment film 3 is preferably in 2-fold rotational symmetry with respect to the two predetermined lines P. In the present embodiment, the two predetermined lines P are located along a same straight direction and are perpendicular to any one of the two lateral edges 35 of the disposable adjustment film 3, so that the disposable adjustment film 3 is in mirror symmetry with respect to the two predetermined lines P, but the present disclosure is not limited thereto.

Specifically, a first portion of the disposable adjustment film 3 including any one of the two predetermined lines P has a structural strength that is weaker than a structural strength of a second portion of the disposable adjustment film 3 surrounding the first portion, so that the disposable adjustment film 3 can be easily broken along the two predetermined lines P by being applied with forces. In the present embodiment, the disposable adjustment film 3 has a plurality of thru-holes 37 arranged along the two predetermined lines P. Any two of the thru-holes 37 adjacent to each other can be separate from each other or can be partially in spatial communication with each other. In addition, each of the two end edges 36 of the disposable adjustment film 3 can include at least one manipulation portion 361 being in a protruding shape.

Figure 5:
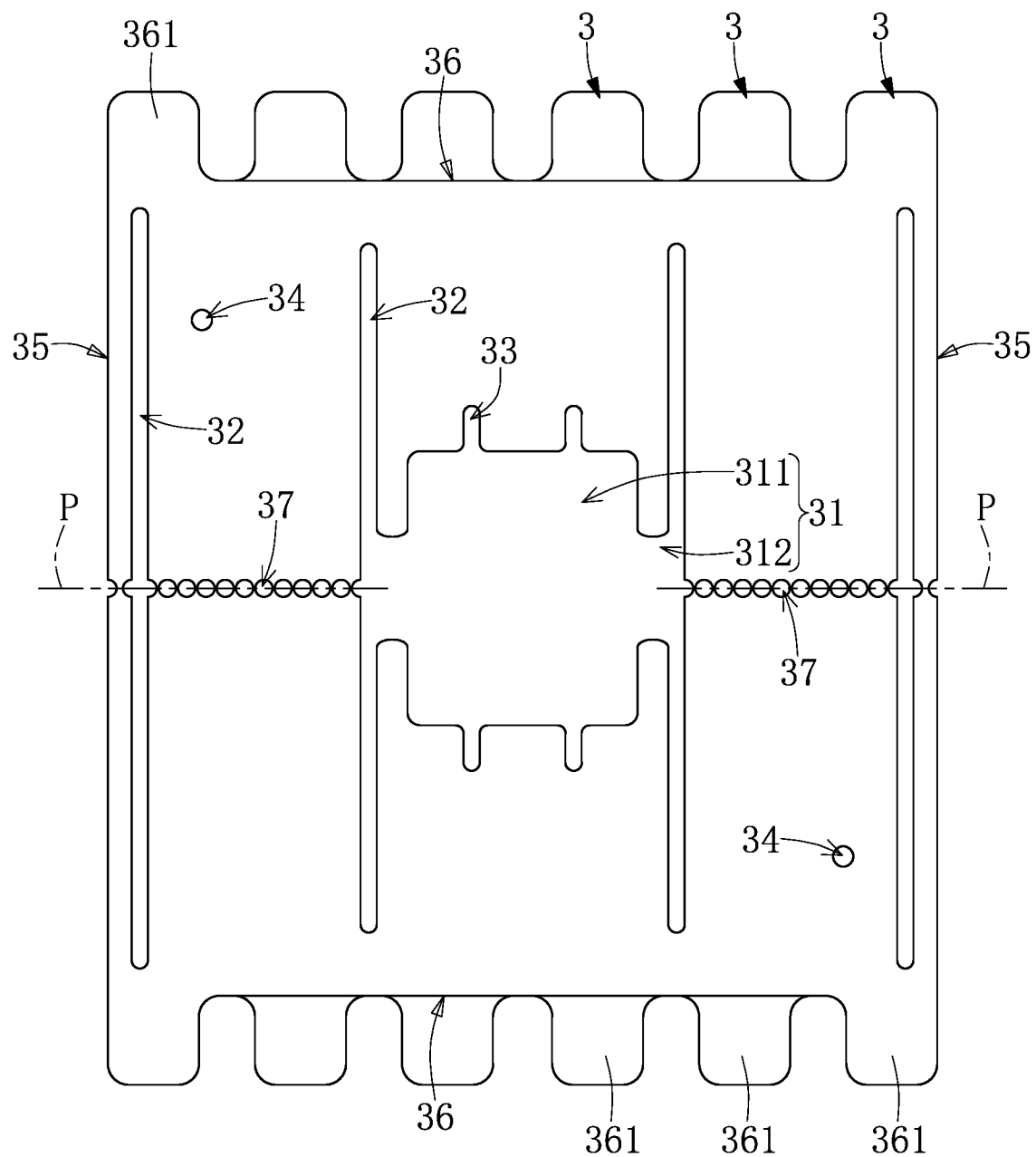
FIG. 5 is a top view of the disposable adjustment films stacked with each other according to the first embodiment of the present disclosure.

As shown in FIG. 4 and FIG. 5, in any two of the disposable adjustment films 3 adjacent to each other, the manipulation portions 361 are in a staggered arrangement, and a contour of one of the any two of the disposable adjustment films 3 (e.g., the probe hole 31, the first slots 32, the second slots 33, the aligning holes 34, and the two lateral edges 35) other than the at least one manipulation portion 361 is substantially flush along the height direction H with a contour of another one of the any two of the disposable adjustment films 3, but the present disclosure is not limited thereto.

As shown in FIG. 1, FIG. 3, and FIG. 4, the fasteners 4 fix the two guiding board units 1, the spacing board 2, and the disposable adjustment films 3 by passing through the probe holder 100, and the fasteners 4 respectively pass through the first slots 32 of each of the disposable adjustment films 3. In the present embodiment, a quantity of the fasteners 4 is twice of a quantity of the first slots 32, so that two ends of any one of the first slots 32 can be respectively provided with two of the fasteners 4 passing there-through. Moreover, the guiding pins 5 are inserted into the two guiding board units 1, the spacing board 2, and the disposable adjustment films 3, and the guiding pins 5 respectively pass through the second slots 33 of each of the disposable adjustment films 3.

Figure 6:
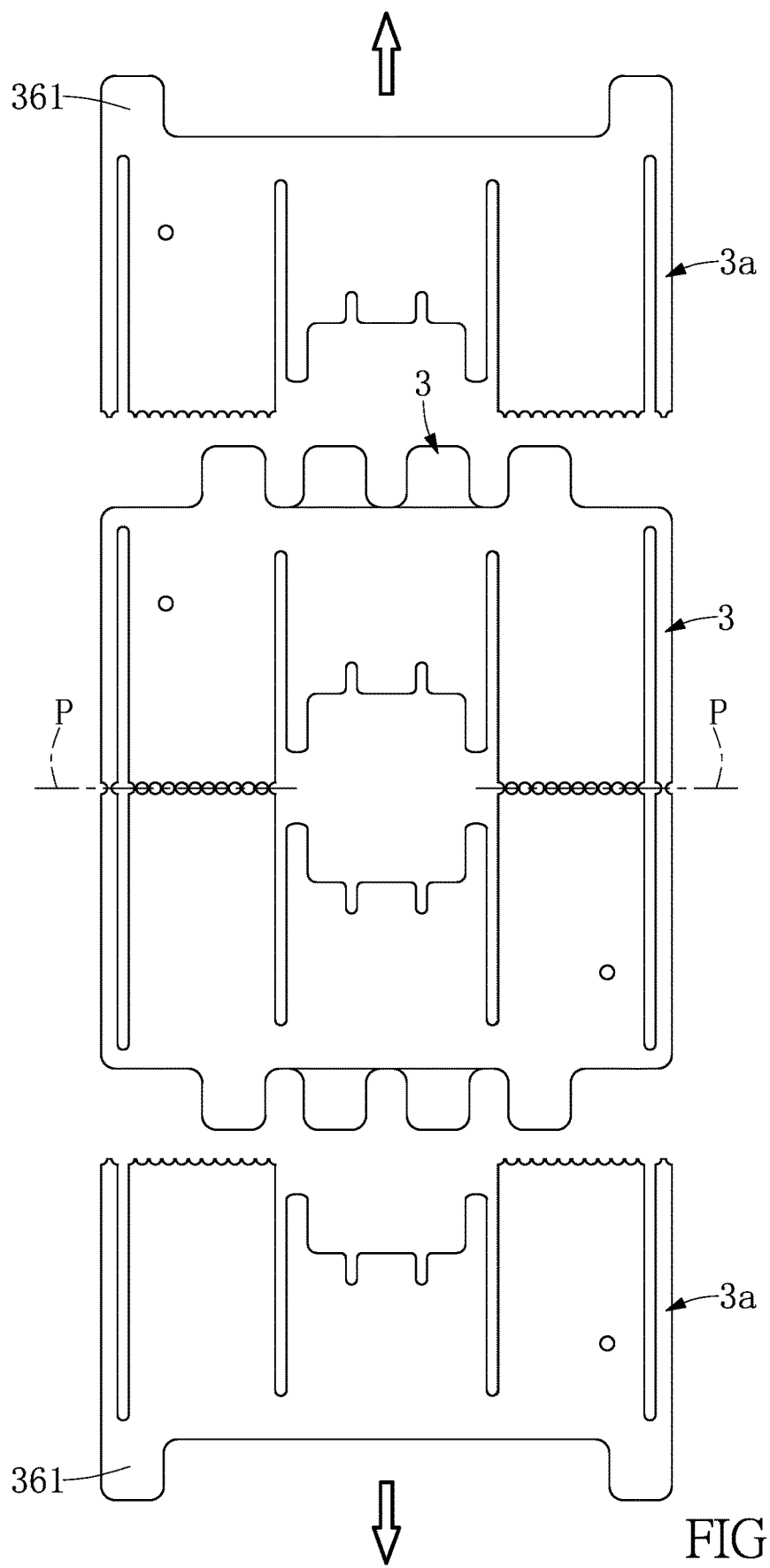
FIG. 6 is a top view showing one of the disposable adjustment films of FIG. 5 broken into two abandoned films.

The above description describes the structure of the probe holder 100, and the following description describes the operation of the probe holder 100 (as shown in FIG. 6).

In a plane perpendicular to the height direction H (e.g., a plane at which the disposable adjustment film 3 is located), when any one of the disposable adjustment films 3 is applied with forces that act in opposite directions (e.g., an upward direction and a downward direction shown in FIG. 6) and that are parallel to any one of the first slots 32, the any one of the disposable adjustment films 3 is broken into two abandoned films 3a along the two predetermined lines P, and the two abandoned films 3a are moved along the fasteners 4 and the guiding pins 5 through the first slots 32 and the second slots 33 so as to be removed from the probe holder 100, thereby reducing a total height of the probe holder 100.

Specifically, any one of the disposable adjustment films 3 can be broken into the two abandoned films 3a by being applied with forces after the fasteners 4 of the probe holder 100 are released, and then the fasteners 4 can be tightly secured to fix the relative positioning of the components of the probe holder 100. Moreover, the two abandoned films 3a in the present embodiment are of the substantially same structure or the symmetrical structure, but the present disclosure is not limited thereto.

Accordingly, each of the disposable adjustment films 3 in the present embodiment is integrally formed as a single one-piece structure to allow the same to be retained or limited by other components (e.g., the fasteners 4 and the guiding pins 5), so that any one of the disposable adjustment films 3 does not affect or move another one of the disposable adjustment films 3 when being broken into the two abandoned films 3a by being applied with forces, thereby maintaining the precision of the probe holder 100.

As shown in FIG. 1 to FIG. 3, the conductive probes 200 are assembled to the probe holder 100. The conductive probes 20 pass through the probe hole 31 of each of the disposable adjustment films 3, and pass through the two guiding board units 1 and the spacing board 2. Moreover, an end of each of the conductive probes 200 (e.g., a top end of each of the conductive probes 200 shown in FIG. 3) is arranged outside of one of the two guiding board units 1 and is fixed to the space transformer 300, and another end of each of the conductive probes 200 (e.g., a bottom end of each of the conductive probes 200 shown in FIG. 3) is arranged outside of another one of the two guiding board units 1 and is defined as a testing segment 201 configured to test a device under test (DUT) (not shown in the drawings; e.g., a semi-conductor wafer). The testing segment 201 of each of the conductive probes 200 substantially has a predetermined length L0.

It should be noted that the structural design of the conductive probe 200 of the probe card device 1000 can be adjusted or changed according to design requirements, and the two guiding board units 1 of the probe holder 100 can be provided in a staggered arrangement or not in a staggered arrangement according to the structural design of the conductive probe 200.

The conductive probe 200 in the present embodiment is in cooperation with the two guiding board units 1 in the staggered arrangement. In other words, the probe holder 100 in the present embodiment is configured to be adjusted from an assembling mode (as shown in FIG. 2) to a testing mode (as shown in FIG. 3) by adjusting a relative positioning of the two guiding board units 1 (e.g., the two guiding board units 1 are adjusted to be in the staggered arrangement), but the present disclosure is not limited thereto.

Specifically, as shown in FIG. 2, when the probe holder 100 is in the assembling mode, each of the disposable adjustment films 3 is maintained at a predetermined position through the aligning holes 34 (e.g., the aligning holes 34 allow the guiding pins 5 to be respectively inserted thereinto), so that each of the conductive probes 200 easily passes through the probe holder 100 and passes through the placing hole 311 (not the two buffering holes 312).

Moreover, as shown in FIG. 3, when the probe holder 100 is in the testing mode, the two guiding board units 1 are in the staggered arrangement, each of the conductive probes 200 is deformed to be in a curved shape, and each of the buffering holes 312 of any one of the disposable adjustment films 3 allows at least one of the conductive probes 200 to pass there-through. In other words, the two buffering holes 312 of any one of the disposable adjustment films 3 provide a space required for the deformation of the conductive probes 200.

Figure 7:
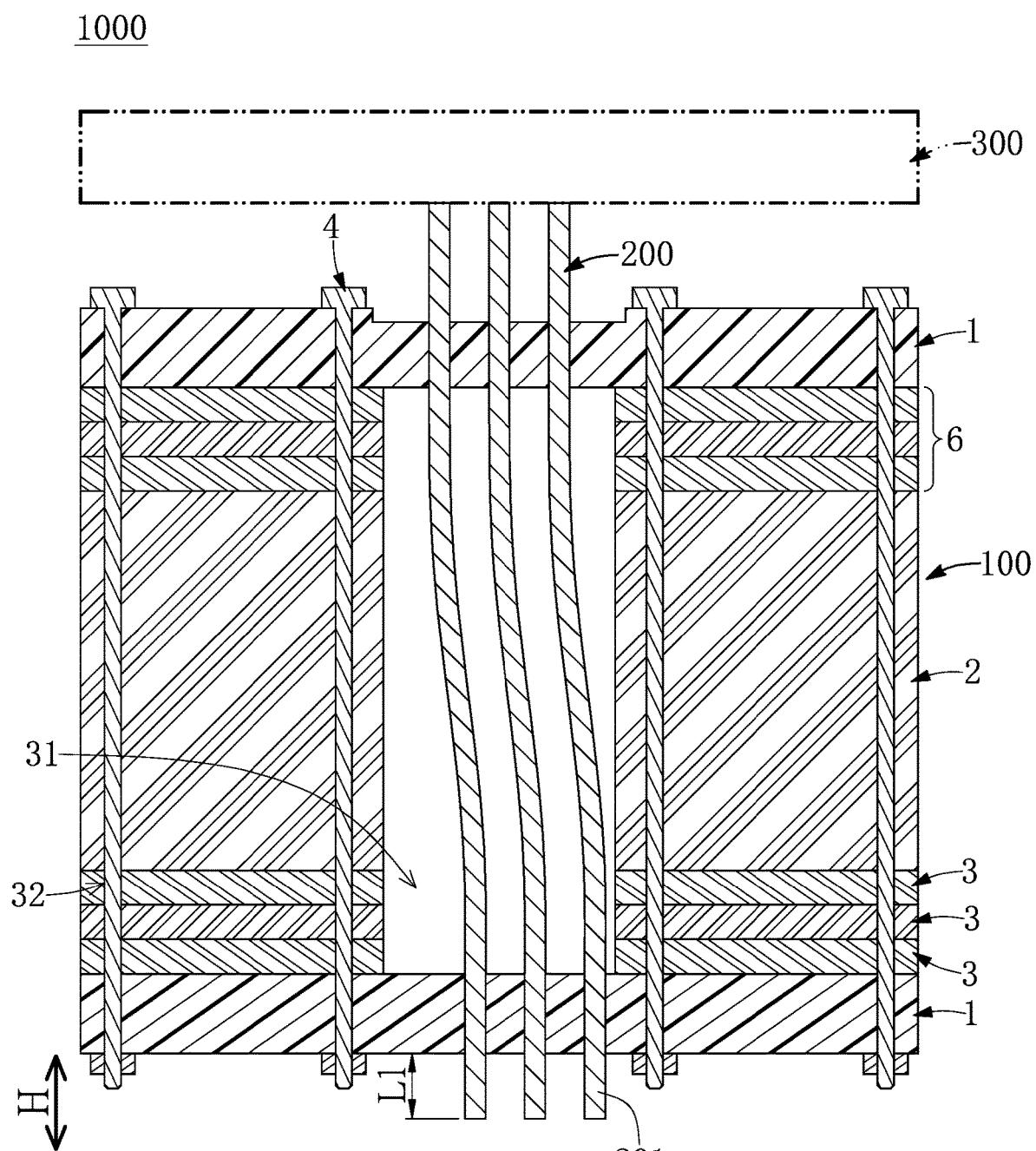
FIG. 7 is a cross-sectional view showing testing segments of conductive probes of FIG. 3 each worn away by a predetermined wear amount.
Figure 8:
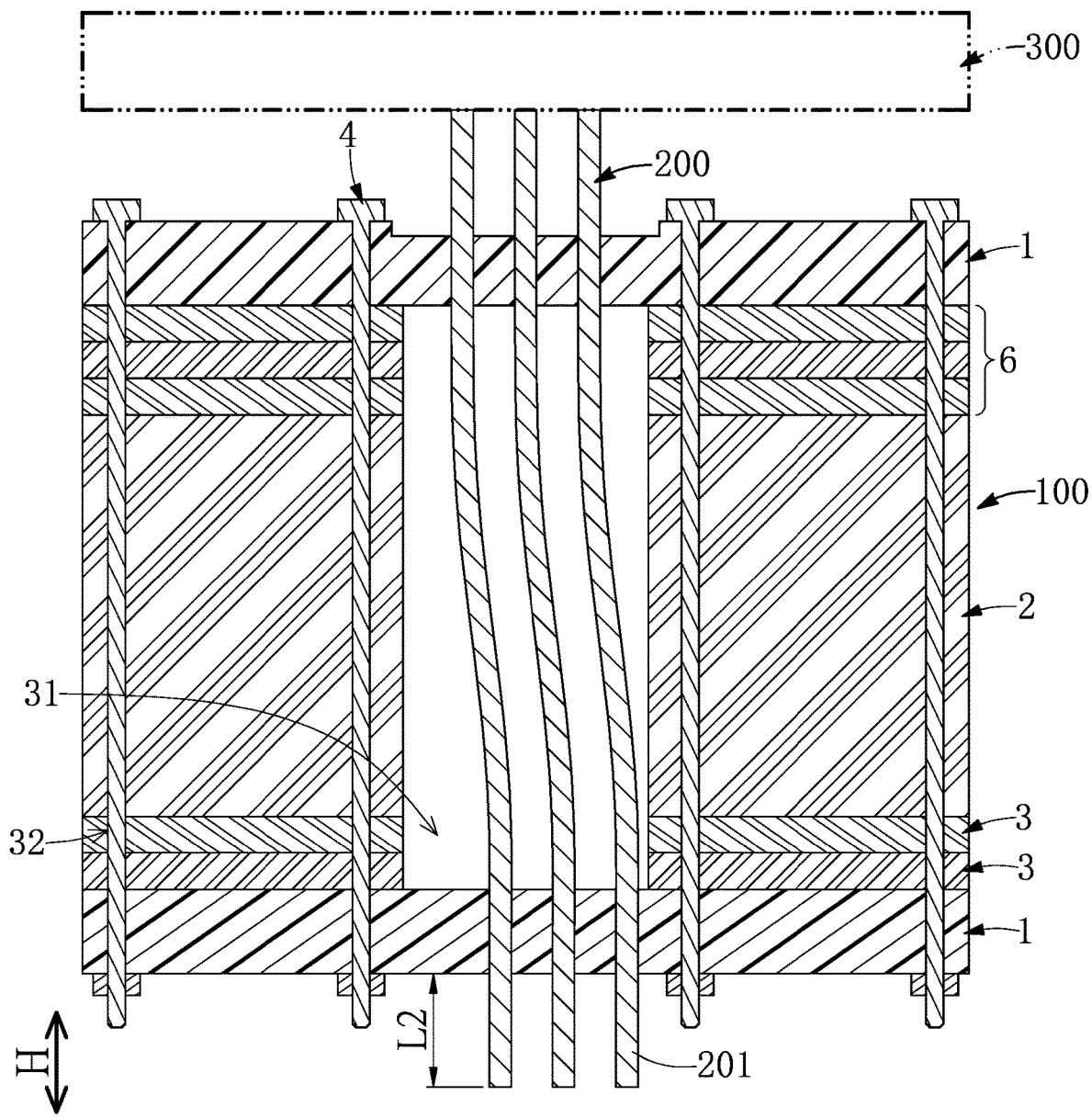
FIG. 8 is a cross-sectional view showing the probe card device of FIG. 7 after one of the disposable adjustment films is removed from the probe holder.

Specifically, as shown in FIG. 3, FIG. 7, and FIG. 8, when the testing segment 201 of each of the conductive probes 200 is worn away by a predetermined wear amount (e.g., a length of the testing segment 201 shown in FIG. 7 becomes a shortening length L1 less than the predetermined length L0), one of the disposable adjustment films 3 is broken into the two abandoned films 3a removed from the probe holder 100

(shown in FIG. 6 and FIG. 8), and the fasteners 4 are used to reduce a distance between the two guiding board units 1 so as to extend the testing segment 201 of each of the conductive probes 200 to have a reworking length L2 that is equal to or greater than the predetermined length L0.

Figure 9:
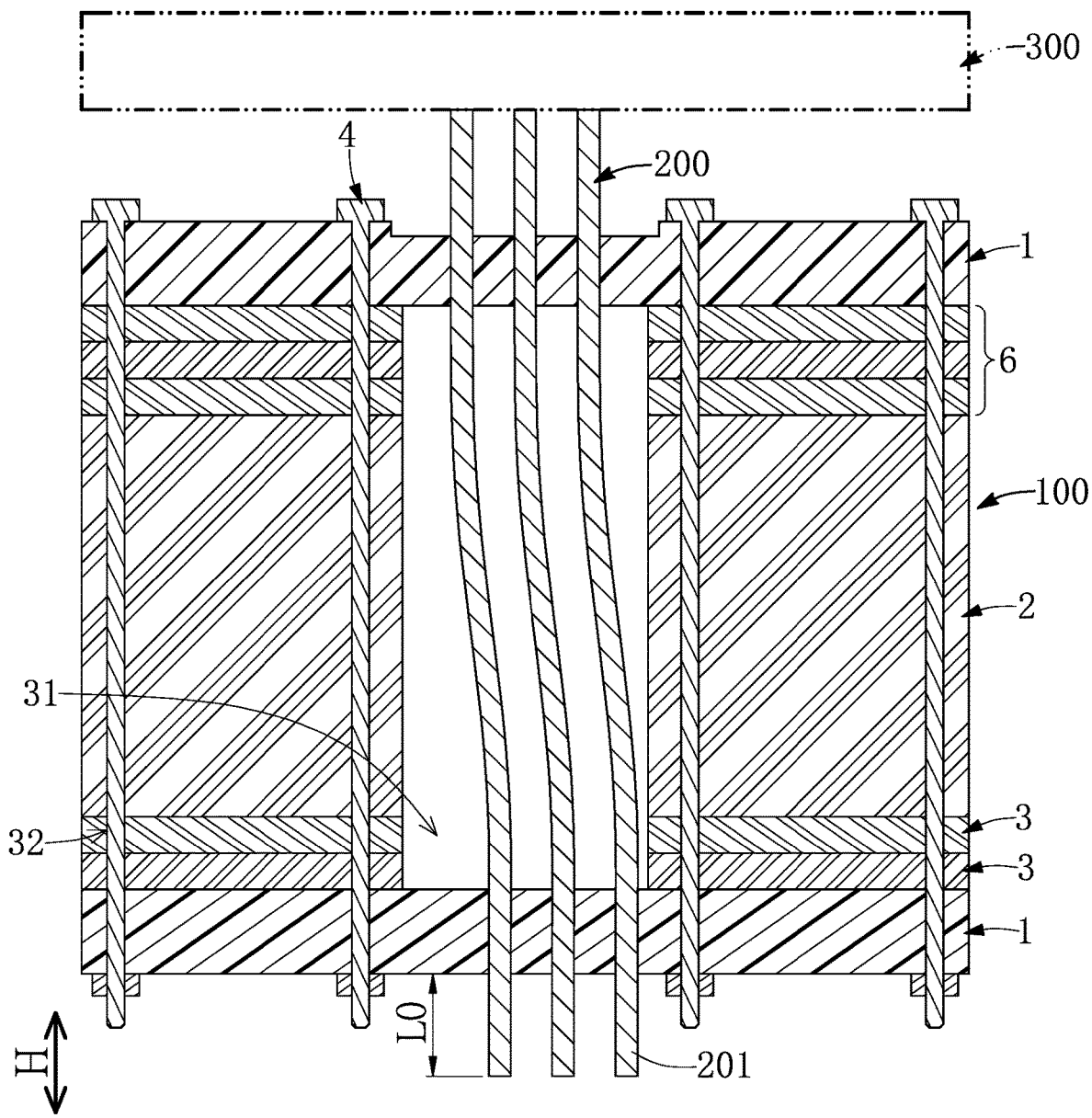
FIG. 9 is a cross-sectional view showing the probe card device of FIG. 8 after a flattening process is applied to the testing segments of the conductive probes.

Preferably, as shown in FIG. 8 and FIG. 9, the predetermined wear amount is 70% to 80% of a thickness of any one of the disposable adjustment films 3, and the reworking length L2 is greater than the predetermined length L0. Moreover, the testing segment 201 of each of the conductive probes 200 having the reworking length L2 is configured to be shortened to have the predetermined length L0 by a flattening process so as to allow free ends of the testing segments 201 of the conductive probes 200 to be coplanar with each other. Accordingly, the probe card device 100 can be continuously used to test the DUT after the flattening process.

Second Embodiment

Figure 10:
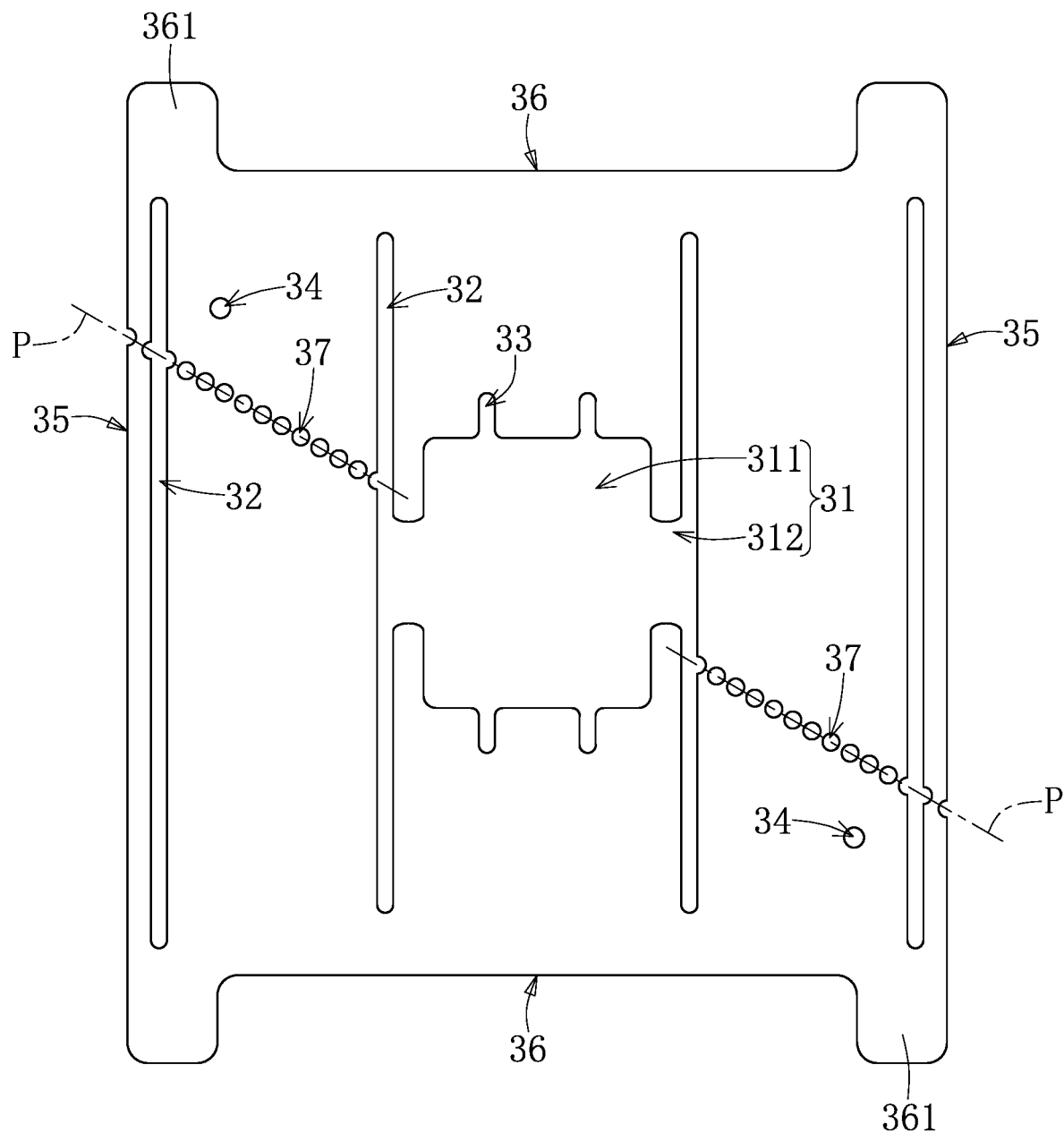
FIG. 10 is a top view of the disposable adjustment film according to a second embodiment of the present disclosure.

Referring to FIG. 10, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, the disposable adjustment film 3 defines two predetermined lines P slantingly extending from the two lateral edges 35 thereof to the probe hole 31, respectively. The two predetermined lines P respectively extend across the first slots 32, and the disposable adjustment film 3 is preferably a 2-fold rotational symmetry with respect to the two predetermined lines P. Moreover, the two predetermined lines P are located along a same straight direction, and any one of the two lateral edges 35 of the disposable adjustment film 3 and the straight direction have an acute angle there-between, but the present disclosure is not limited thereto.

Third Embodiment

Figure 11:
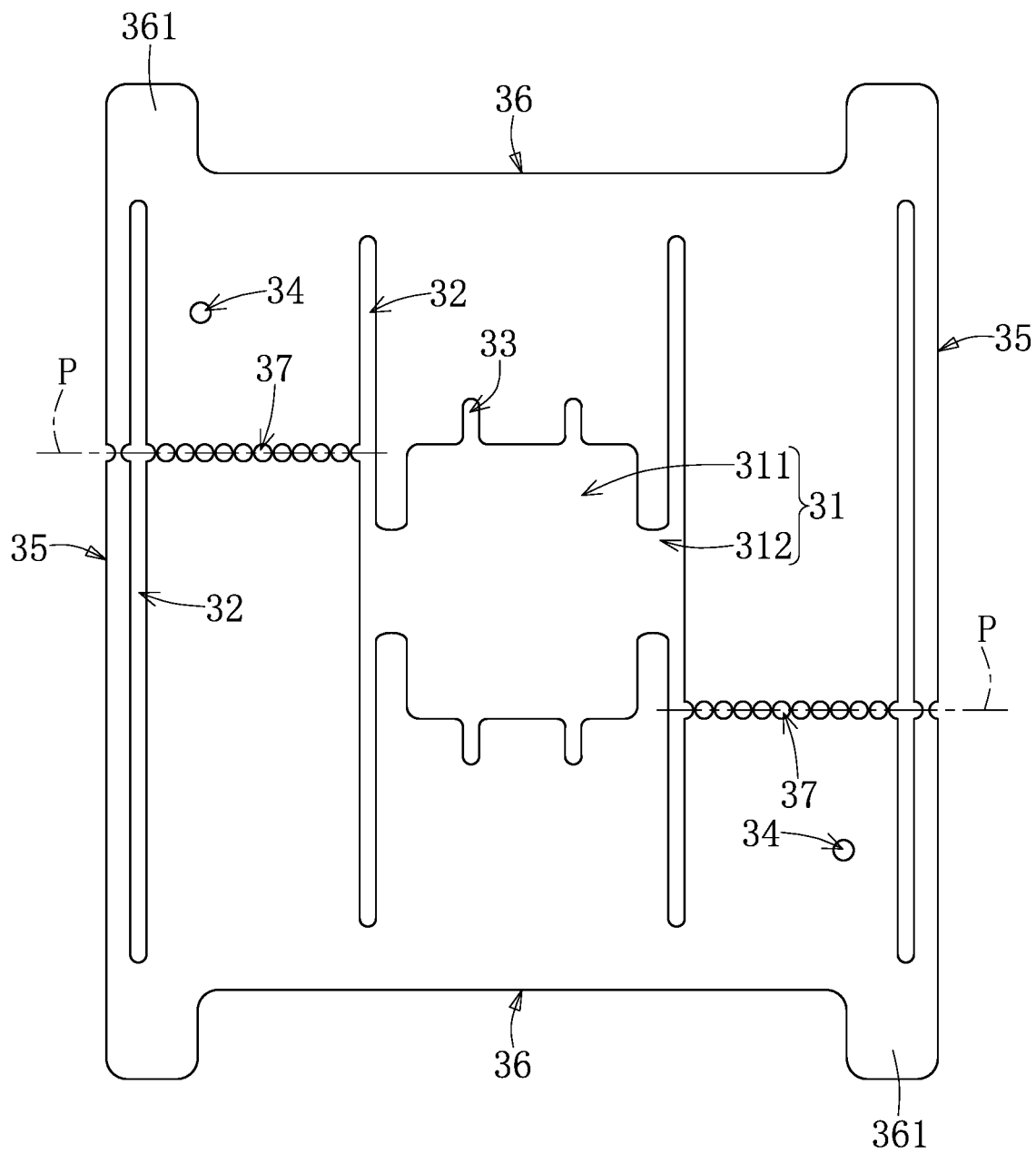
FIG. 11 is a top view of the disposable adjustment film according to a third embodiment of the present disclosure.

Referring to FIG. 11, a third embodiment of the present disclosure is similar to the first embodiment of the present disclosure. For the sake of brevity, descriptions of the same components in the first and third embodiments of the present disclosure will be omitted herein, and the following description only discloses different features between the first and third embodiments.

In the present embodiment, the disposable adjustment film 3 defines two predetermined lines P perpendicularly extending from the two lateral edges 35 thereof to the probe hole 31, respectively. The two predetermined lines P respectively extend across the first slots 32, and the disposable adjustment film 3 is preferably a 2-fold rotational symmetry with respect to the two predetermined lines P. Moreover, the two predetermined lines P are respectively located along two different straight directions, but the present disclosure is not limited thereto.

Beneficial Effects of the Embodiments

In conclusion, each of the disposable adjustment films of the probe card device in the present disclosure is integrally formed as a single one-piece structure to allow the same to be retained or limited by other components (e.g., the fasteners and the guiding pins), so that any one of the disposable adjustment films does not affect or move another one of the disposable adjustment films when being broken into the two abandoned films by being applied with forces, thereby maintaining the precision of the probe holder.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   a probe holder including:
   two guiding board units spaced apart from each other;
   a spacing board located between the two guiding board units;
   a plurality of disposable adjustment films stacked along a height direction and sandwiched between the spacing board and at least one of the two guiding board units, wherein each of the disposable adjustment films is integrally formed as a single one-piece structure and has a probe hole and a plurality of first slots that are parallel to each other, wherein each of the disposable adjustment films defines two predetermined lines respectively extending from two opposite lateral edges thereof to the probe hole, and wherein the two predetermined lines respectively extend across the first slots; and
   a plurality of fasteners fixing the two guiding board units, the spacing board, and the disposable adjustment films, wherein the fasteners respectively pass through the first slots of each of the disposable adjustment films; and
   a plurality of conductive probes assembled to the probe holder and passing through the probe hole of each of the disposable adjustment films;
   wherein, in a plane perpendicular to the height direction, when any one of the disposable adjustment films is applied with forces that act in opposite directions and that are parallel to any one of the first slots, the any one of the disposable adjustment films is broken into two abandoned films along the two predetermined lines, and the two abandoned films are moved along the fasteners through the first slots so as to be removed from the probe holder.

2. The probe card device according to claim 1, wherein each of the disposable adjustment films has a plurality of aligning holes, and the probe holder is configured to be adjusted from an assembling mode to a testing mode by adjusting a relative positioning of the two guiding board units, and wherein, when the probe holder is in the assembling mode, each of the disposable adjustment films is maintained at a predetermined position through the aligning holes.

3. The probe card device according to claim 2, wherein, in each of the disposable adjustment films, the probe hole has a placing hole and two buffering holes that are in spatial communication with two opposite sides of the placing hole, respectively, wherein, when the probe holder is in the assembling mode, the conductive probes pass through the placing hole of each of the disposable adjustment films, and wherein, when the probe holder is in the testing mode, the two guiding board units are in a staggered arrangement, each of the conductive probes is deformed to be in a curved shape, and each of the buffering holes of any one of the disposable adjustment films allows at least one of the conductive probes to pass there-through.

4. The probe card device according to claim 1, wherein each of the disposable adjustment films has a plurality of second slots in spatial communication with the probe hole, and the probe holder includes a plurality of guiding pins inserted into the two guiding board units, the spacing board, and the disposable adjustment films, and wherein the guiding pins respectively pass through the second slots of each of the disposable adjustment films.

5. The probe card device according to claim 1, wherein each of the disposable adjustment films has two end edges each being perpendicular to the two lateral edges and each having at least one manipulation portion, and wherein, in any two of the disposable adjustment films adjacent to each other, the manipulation portions are in a staggered arrangement.

6. The probe card device according to claim 1, wherein each of the disposable adjustment films has a plurality of thru-holes arranged along the two predetermined lines and has a thickness within a range from 50 µm to 500 µm, and a difference between the thicknesses of any two of the disposable adjustment films is less than or equal to 10 µm.

7. The probe card device according to claim 1, further comprising a space transformer, wherein an end of each of the conductive probes is arranged outside of one of the two guiding board units and is fixed to the space transformer, and another end of each of the conductive probes is arranged outside of another one of the two guiding board units and is defined as a testing segment configured to test a device under test (DUT), and wherein the disposable adjustment films are sandwiched between the spacing board and the guiding board unit that is away from the space transformer.

8. The probe card device according to claim 7, wherein the testing segment of each of the conductive probes has a predetermined length, and wherein, when the testing segment of each of the conductive probes is worn away by a predetermined wear amount, one of the disposable adjustment films is broken into the two abandoned films removed from the probe holder, and the fasteners are used to reduce a distance between the two guiding board units so as to extend the testing segment of each of the conductive probes to have a reworking length that is equal to or greater than the predetermined length.

9. The probe card device according to claim 8, wherein the predetermined wear amount is 70% to 80% of a thickness of any one of the disposable adjustment films, and the reworking length is greater than the predetermined length, and wherein the testing segment of each of the conductive probes having the reworking length is configured to be shortened to have the predetermined length by a flattening process so as to allow free ends of the testing segments of the conductive probes to be coplanar with each other.

10. A disposable adjustment film of a probe card device, the disposable adjustment film being integrally formed as a single one-piece structure, and the disposable adjustment film comprising:
   a probe hole; and
   a plurality of first slots parallel to each other, wherein the disposable adjustment film defines two predetermined lines respectively extending from two opposite lateral edges thereof to the probe hole, and wherein the two predetermined lines respectively extend across the first slots;
   wherein, in a plane at which the disposable adjustment film is located, when the disposable adjustment film is applied with forces that act in opposite directions and that are parallel to any one of the first slots, the disposable adjustment film is broken into two abandoned films along the two predetermined lines.

* * * * *